(12) United States Patent
Chen et al.

(10) Patent No.: US 11,844,205 B2
(45) Date of Patent: Dec. 12, 2023

(54) SEMICONDUCTOR DEVICE INCLUDING TRIMMED-GATES AND METHOD OF FORMING SAME

(71) Applicant: TAIWAN SEMICONDUCTOR MANUFACTURING COMPANY, LTD., Hsinchu (TW)

(72) Inventors: Yu-Jen Chen, Hsinchu (TW); Wen-Hsi Lee, Hsinchu (TW); Ling-Sung Wang, Hsinchu (TW); I-Shan Huang, Hsinchu (TW); Chan-yu Hung, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/171,949

(22) Filed: Feb. 21, 2023

(65) Prior Publication Data

US 2023/0284428 A1 Sep. 7, 2023

Related U.S. Application Data

(60) Continuation of application No. 17/346,579, filed on Jun. 14, 2021, now Pat. No. 11,587,937, which is a
(Continued)

(51) Int. Cl.
| | |
|---|---|
| *G06F 7/50* | (2006.01) |
| *H10B 10/00* | (2023.01) |
| *H01L 23/528* | (2006.01) |
| *H01L 27/088* | (2006.01) |
| *G06F 30/39* | (2020.01) |
| *H01L 29/78* | (2006.01) |
| *H01L 29/423* | (2006.01) |

(52) U.S. Cl.
CPC ............ *H10B 10/12* (2023.02); *G06F 30/39* (2020.01); *H01L 23/528* (2013.01); *H01L 27/0886* (2013.01); *H01L 29/4238* (2013.01); *H01L 29/42376* (2013.01); *H01L 29/785* (2013.01)

(58) Field of Classification Search
USPC ......................................... 716/52, 53, 54, 55
See application file for complete search history.

(56) References Cited

U.S. PATENT DOCUMENTS

| 4,051,505 A | 9/1977 | Krambeck et al. |
| 7,260,442 B2 | 8/2007 | Hwang et al. |
| | (Continued) | |

FOREIGN PATENT DOCUMENTS

| CN | 101728387 | 6/2010 |
| JP | 0689989 | 3/1994 |

*Primary Examiner* — Brian Ngo
(74) *Attorney, Agent, or Firm* — Hauptman Ham, LLP

(57) ABSTRACT

A semiconductor device includes: first and second active regions extending in a first direction and separated by a gap relative to a second direction; and gate structures correspondingly over the first and second active regions, the gate structures extending in the second direction; and for each active region, a portion of each of some but not all of the gate structures (gate extension) extending partially into the gap; and when viewing the gate structures as a group, the group having a notched profile relative to the second direction, where notches in the notched profile correspond to ones of the gate structures which are substantially free of extending into the gap.

20 Claims, 10 Drawing Sheets

Related U.S. Application Data continuation of application No. 16/512,175, filed on Jul. 15, 2019, now Pat. No. 11,037,935, which is a division of application No. 15/729,307, filed on Oct. 10, 2017, now Pat. No. 10,373,962.

(60) Provisional application No. 62/511,488, filed on May 26, 2017.

(56) References Cited

U.S. PATENT DOCUMENTS

| | | | |
|---|---|---|---|
| 8,786,019 B2 | 7/2014 | Wu et al. | |
| 9,256,709 B2 | 2/2016 | Yu et al. | |
| 9,318,569 B2 * | 4/2016 | Kwon | H01L 29/40117 |
| 2006/0192266 A1 | 8/2006 | Willer et al. | |
| 2007/0159571 A1 * | 7/2007 | Yang | G02F 1/136259 |
| | | | 349/54 |
| 2012/0008367 A1 | 1/2012 | Kajiyama | |
| 2012/0149135 A1 * | 6/2012 | Sugimura | H01L 21/31144 |
| | | | 257/E21.53 |
| 2013/0154027 A1 | 6/2013 | Liaw | |
| 2014/0040838 A1 | 2/2014 | Liu et al. | |
| 2015/0077680 A1 | 3/2015 | Won et al. | |
| 2015/0111367 A1 | 4/2015 | Lin et al. | |
| 2015/0278429 A1 | 10/2015 | Chang | |
| 2016/0055290 A1 * | 2/2016 | Weng | H01L 27/0886 |
| | | | 716/112 |
| 2016/0078164 A1 * | 3/2016 | Hsieh | H01L 21/3043 |
| | | | 716/55 |
| 2016/0155741 A1 | 6/2016 | Yoo et al. | |
| 2016/0315081 A1 | 10/2016 | Park et al. | |
| 2017/0062403 A1 | 3/2017 | Song et al. | |
| 2017/0098608 A1 | 4/2017 | Jung | |
| 2017/0229462 A1 | 8/2017 | Kim et al. | |
| 2018/0150586 A1 * | 5/2018 | Tien | H01L 27/0207 |
| 2018/0341736 A1 * | 11/2018 | Chen | H01L 29/4238 |

* cited by examiner

SEMICONDUCTOR DEVICE INCLUDING TRIMMED-GATES AND METHOD OF FORMING SAME

PRIORITY CLAIM

The present application is a continuation of U.S. application Ser. No. 17/346,579, filed Jun. 14, 2021, now U.S. Pat. No. 11,587,937, issued Feb. 21, 2023, which is a continuation of U.S. application Ser. No. 16/512,175, filed Jul. 15, 2019, now U.S. Pat. No. 11,037,935, issued Jun. 15, 2021, which is a divisional of U.S. application Ser. No. 15/729,307, filed Oct. 10, 2017, now U.S. Pat. No. 10,373,962, issued Aug. 6, 2019, which claims the priority of U.S. Provisional Application No. 62/511,488, filed May 26, 2017, which are incorporated herein by reference in their entireties.

BACKGROUND

An integrated circuit ("IC") includes one or more semiconductor devices. As electronic devices/components of semiconductor devices decrease in size, the spacing between such electronic devices/components similarly decreases in size. As such spacing decreases, the resistance to leakage current between neighboring components also decreases.

One way in which to represent a semiconductor device is with a plan view diagram referred to as a layout diagram. A designer of a layout diagram configures the layout diagram by taking into consideration, among other things, separation distances achievable between such electronic devices/components.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

DETAILED DESCRIPTION

Figure 1A:
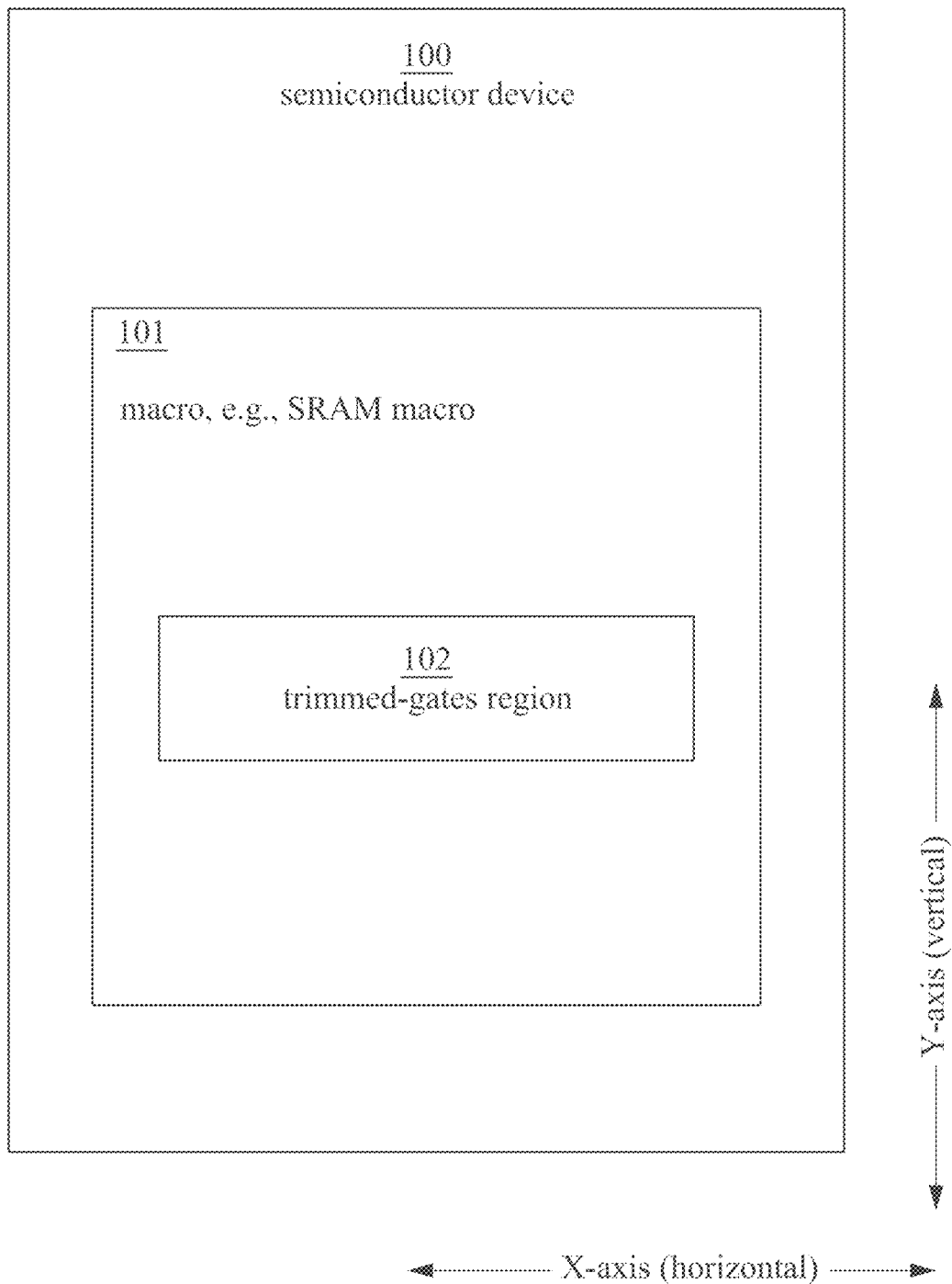
FIG. 1A is a block diagram of a semiconductor device, in accordance with at least one embodiment of the present disclosure.

The following disclosure provides many different embodiments, or examples, for implementing different features of the provided subject matter. Specific examples of components, materials, values, steps, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

For a flyover type of intersection (in which a gate electrode crosses the underlying active region), the gate electrode is NOT functionally connected to the corresponding underlying active region. Whereas the gate electrode for a functional type of intersection (at which the gate electrode IS functionally connected to the corresponding underlying active region) extends into a gap adjacent the flyover intersection, it is recognized that the gate electrode for a flyover intersection does not need to extend into a gap adjacent the flyover intersection. Accordingly, for a flyover intersection, the extension of the gate electrode (that otherwise would have been present) is eliminated by the inclusion of additional cut-patterns adjacent the flyover intersection, thereby trimming the gate electrode. A result is a larger gap between the corresponding portion of the active region and a neighboring structure, e.g., a circuit. Compared to the smaller gap that otherwise would have been present if the extension of the gate electrode would have been present, the larger gap more strongly resists leakage current between the neighboring structure and the corresponding gate electrode having the flyover intersection, which reduces (and thus improves) an intra/inter layer "ON" state gate leakage of the semiconductor device which includes such a trimmed-gates region.

FIG. 1A is a block diagram of a semiconductor device 100, in accordance with at least one embodiment of the present disclosure.

In FIG. 1A, semiconductor device 100 includes, among other things, a circuit macro/module 101. In some embodiments, circuit macro/module 101 is understood in the context of an analogy to the architectural hierarchy of modular programming in which subroutines/procedures are called by a main program (or by other subroutines) to carry out a given computational function. In this context, semiconductor device 100 uses circuit macro/module 101 to form one or more given functions. Accordingly, in this context and in terms of architectural hierarchy, semiconductor device 100 is analogous to the main program and circuit macro/module (hereinafter, macro) 101 is analogous to subroutines/procedures. In some embodiments, macro 101 is a soft macro. In some embodiments, macro 101 is a hard macro. In some embodiments, macro 101 is a soft macro which is described/ couched in register-transfer level (RTL) code. In some embodiments, synthesis, placement and routing have yet to have been performed on macro 101 such that the soft macro can be synthesized, placed and routed for a variety of process nodes. In some embodiments, macro 101 is a hard macro which is described/couched in a binary file format (e.g., Graphic Database System II (GDSII) stream format), where the binary file format represents planar geometric shapes, text labels, other information and the like of one or more layout diagrams of macro 101 in hierarchical form. In some embodiments, synthesis, placement and routing have been performed on macro 101 such that the hard macro is specific to a particular process node.

In some embodiments, macro 101 is an SRAM macro. In some embodiments, macro 101 is another macro such as another type of RAM, a ROM, phase lock loops (PLLs), special function circuits, or the like. Macro 101 includes, among other things, a trimmed-gates region 102. In some embodiments, region 102 corresponds to a part of or an entirety of an instance of a standard cell structure, where the standard cell structure is included in a library of various standard cell structures.

Figure 1B:
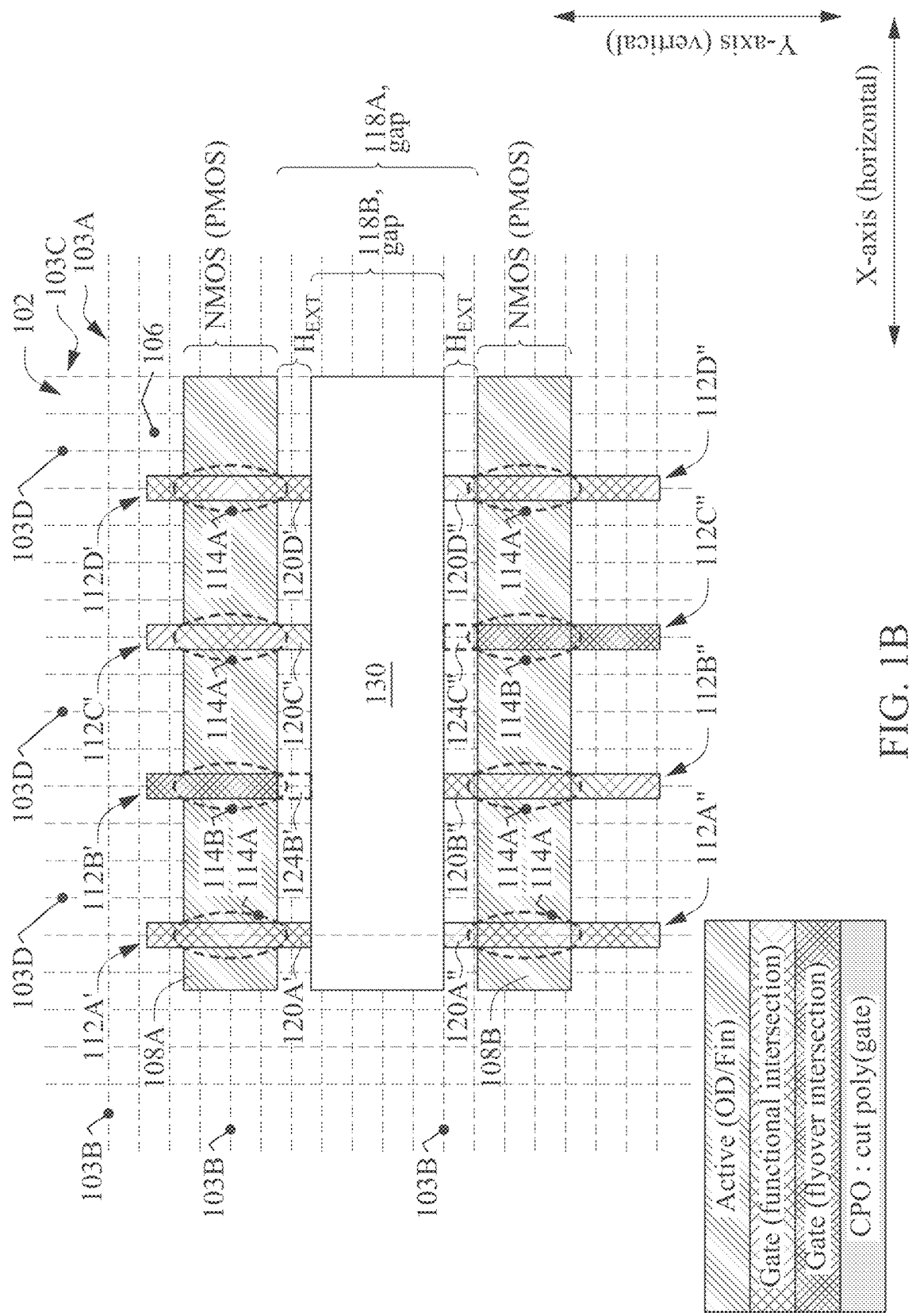
FIG. 1B is a layout diagram of a trimmed-gates region of a semiconductor device, in accordance with at least one embodiment of the present disclosure.

FIG. 1B is a layout diagram of a trimmed-gates region 102 of a semiconductor device, in accordance with at least one embodiment of the present disclosure. In some embodiments, the semiconductor device is semiconductor device 100 of FIG. 1.

Figure 2A:
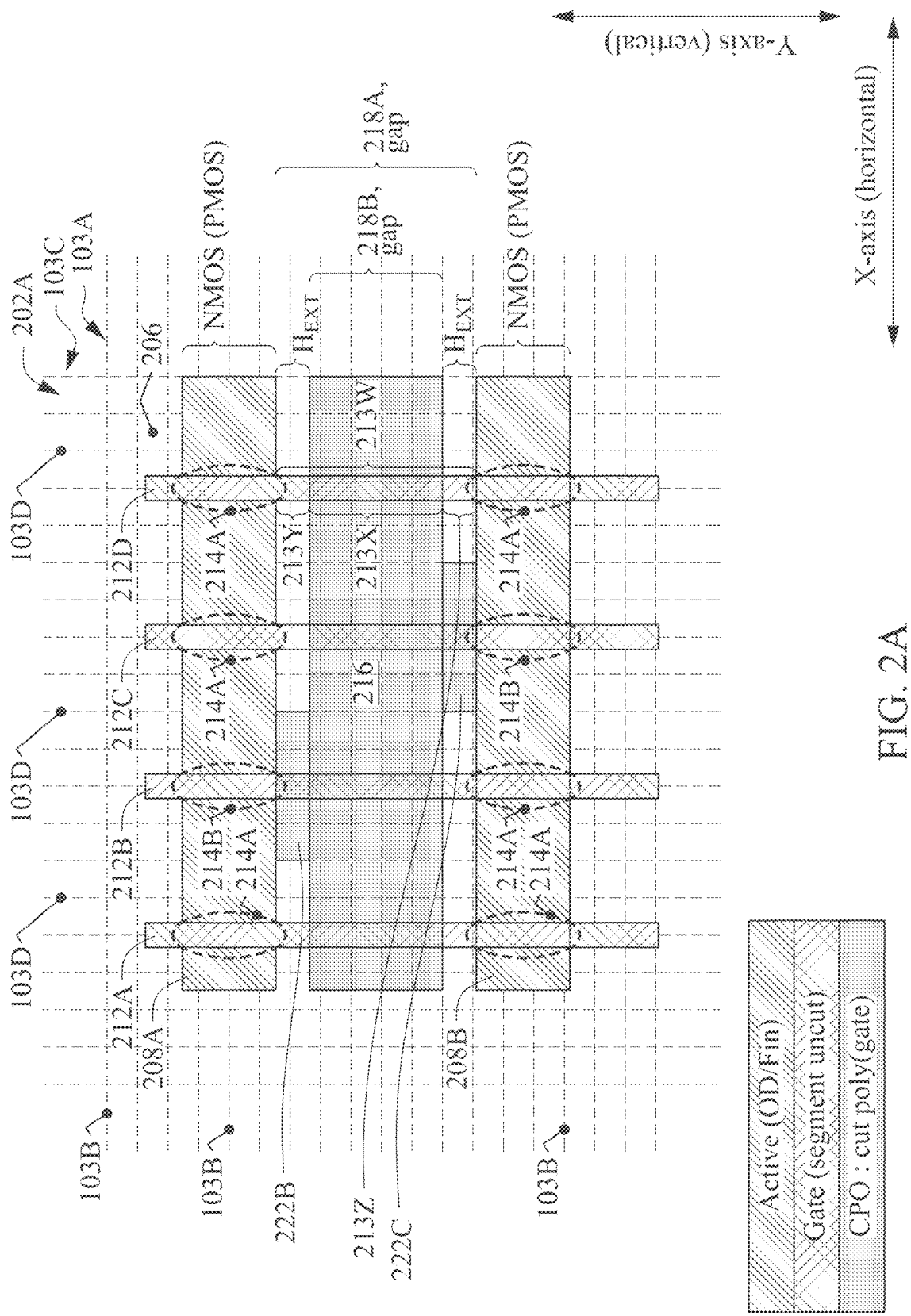
FIG. 2A is a layout diagram of a trimmed-gates region of a semiconductor device, in accordance with some embodiments.
Figure 2B:
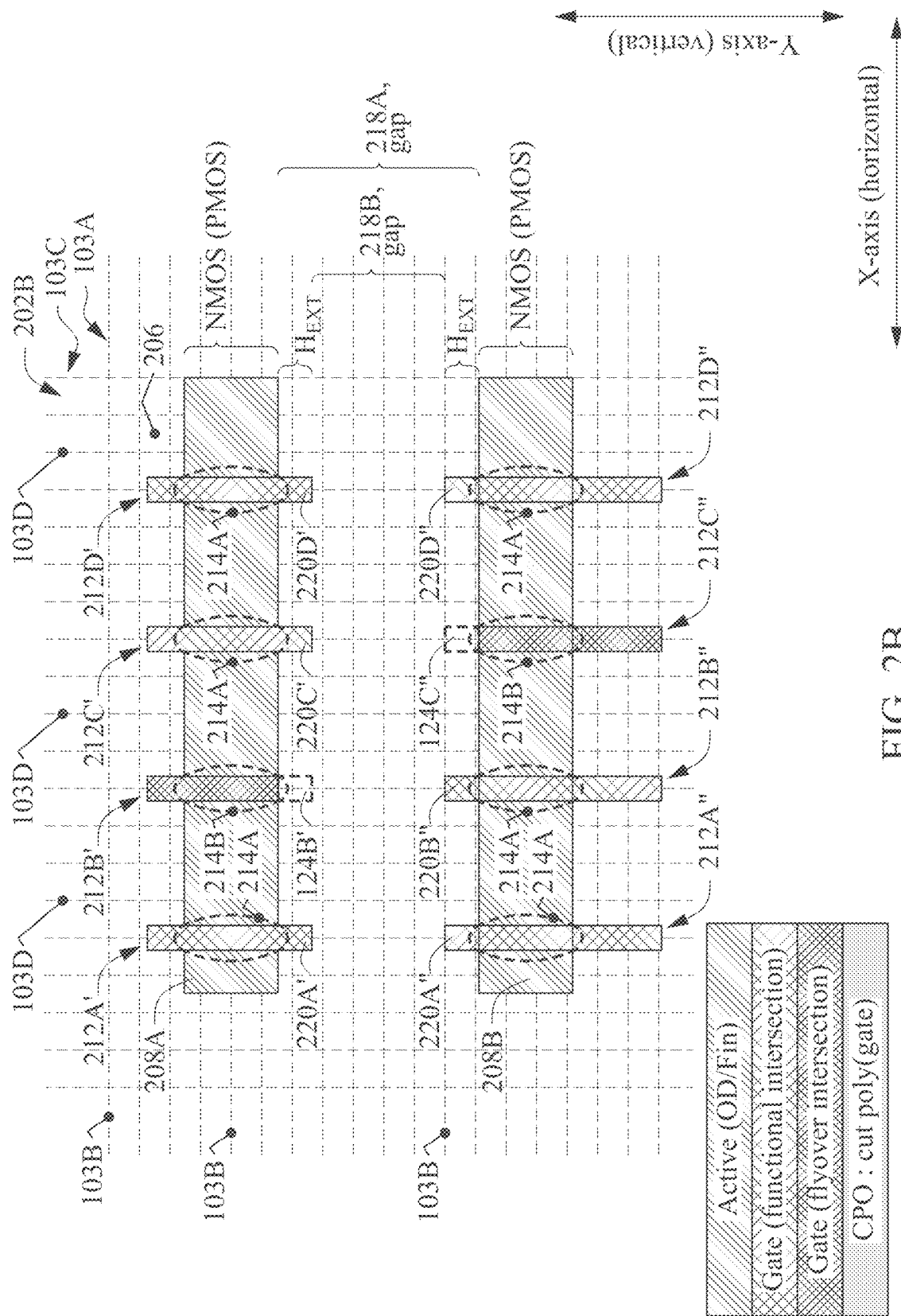
FIG. 2B is a layout diagram of a trimmed-gates region of a semiconductor device, in accordance with some embodiments.

There are at least two types of layout diagrams. A first (or 'pre-cut') type of layout diagram represents inchoate structures and corresponding 'cut' regions. FIGS. 2A-2B (discussed below) are examples of a pre-cut layout diagram. A second (or 'post-cut') type of layout diagram represents the structures resulting from the corresponding pre-cut layout diagram. FIG. 1B is an example of a post-cut layout diagram. Regarding the pre-cut layout diagram, an inchoate version of a structure refers to a version of the structure which is not yet completed or fully developed. A cut region of a pre-cut layout diagram indicates that a portion of a corresponding structure underlying the cut region will be removed (or cut). Here, because a portion of a given structure which underlies a corresponding cut region will be removed (or cut), the given structure is not yet completed or fully developed, and so the given structure is referred to herein as an inchoate structure.

In FIG. 1B, active areas 108A-108B are formed as substantially rectangular shapes disposed on and/or over a substrate 106, where long axes of active areas 108A-108B are substantially parallel to a first direction. The phrase "substantially parallel" should be understood in the context of variations which result from manufacturing process-tolerances. Active areas 108A-108B are separated by a gap 118A, relative to a second direction, where the second direction is substantially perpendicular to the first direction. The phrase "substantially perpendicular" should be understood in the context of variations which result from manufacturing process-tolerances. Gate electrodes 112A', 112A", 112B', 112B", 112C', 112C", 112D' and 112D" are formed as substantially rectangular shapes over corresponding active areas 108A-108B, where long axes of gate electrodes 112A', 112A", 112B', 112B", 112C', 112C", 112D' and 112D" are substantially parallel to the second direction. In a gap 118B which separates gate electrodes 112A', 112B', 112C' and 112D' and corresponding gate electrodes 112A", 112B", 112C" and 112D", relative to the second direction, a structure 130 is formed on and/or over a substrate 106. In some embodiments, structure 130 includes at least some components of a circuit. In some embodiments, structure 130 includes at least a portion of a power rail/strap, e.g., VDD, VSS or the like.

As noted, active areas 108A-108B are formed as substantially rectangular shapes. In some embodiments, active areas 108A-108B have other shapes. For simplicity of illustration, FIG. 1B shows two active areas, namely 108A-108B. In some embodiments, greater numbers of active areas are provided. Active areas 108A-108B are arranged relative to a first grid 103A which is imaginary and which includes parallel first reference lines/tracks 103B which are imaginary and which lie parallel to the first direction. In FIG. 1B, the first direction is the horizontal direction. In some embodiments, the first direction is a direction other than the horizontal direction.

In some embodiments, active areas 108A-108B are configured for NMOS technology. In some embodiments, active areas 108A-108B are configured for PMOS technology. In some embodiments, active area 108A is configured for NMOS technology and active area 108B is configured for PMOS technology. In some embodiments, active area 108A is configured for PMOS technology and active area 108B is configured for NMOS technology. In some embodiments, active areas 108A-108B are configured for planar FET technology. In some embodiments, active areas 108A-108B are configured for finFET technology. Where configured for finFET technology, active areas 108A-108B include instances of fins (not shown) arranged substantially at least parallel to, if not collinearly with respect to, corresponding ones of first reference lines/tracks 103B, and thus are substantially parallel to the horizontal direction. The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. Additional details regarding the structure and manufacture of CMOS finFET technology are disclosed in commonly assigned U.S. Pat. No. 8,786,019, granted Jul. 22, 2014, the entirety of which is hereby incorporated by reference.

In some embodiments, active areas are configured into one or more instances of a first row which are interleaved with one or more instances of a second row. Each instance of the first row and of the second row is arranged to be substantially parallel to the first direction. Each instance of the first row and of the second row includes a predetermined number of the first reference lines/tracks 103B. In some embodiments, instances of the first row have a first conductivity and instances of the second row have a second conductivity. In some embodiments, instances of the first row are configured for PMOS technology and instances of the second row are configured for NMOS technology. In some embodiments, instances of the first row are configured for NMOS technology and instances of the second row are configured for PMOS technology.

As noted, gate electrodes 112A', 112A", 112B', 112B", 112C', 112C", 112D' and 112D" are formed as substantially rectangular shapes. In some embodiments, gate electrodes 112A', 112A", 112B', 112B", 112C', 112C", 112D' and 112D" have other shapes. For simplicity of illustration, FIG. 1B shows eight gate electrodes, namely 112A', 112A", 112B', 112B", 112C', 112C", 112D' and 112D". In some embodiments, fewer or greater numbers of gate electrodes are provided. Gate electrodes 112A', 112A", 112B', 112B", 112C', 112C", 112D' and 112D" are arranged relative to a second grid 103C which is imaginary and which further includes parallel second reference lines/tracks 103D which are imaginary and which lie parallel to the second direction. In some embodiments, the second direction is the vertical direction.

Where gate electrodes 112A', 112A", 112B', 112B", 112C', 112C", 112D' and 112D" cross over corresponding portions of active areas 108A-108B, two types of intersections are described, namely a functional intersection 114A and a flyover intersection 114B. For functional intersection 114A, the gate electrode is functionally connected to the corresponding underlying active region, and so extends bilaterally in the vertical direction from the corresponding underlying active region including extending substantially into gap 118A. For flyover intersection 114B, the gate electrode is NOT functionally connected to the corresponding underlying active region, and so extends at most unilaterally in the vertical direction from the corresponding underlying active region, but does not extend substantially into gap 118A. In some embodiments, flyover intersection 114B results from a circumstance in which the gate electrode is a dummy gate electrode. In some embodiments, flyover intersection 114B results from a circumstance in which the portion of the gate electrode which crosses over the active area serves as an interconnect type of conductor for structures other than the active area. In FIG. 1B: gate electrodes 112A', 112C' and 112D' are arranged to cross over active area 108A with corresponding instances of functional intersection 114A; gate electrode 112B' is arranged to cross over active area 108A with an instance of flyover intersection 114B; gate electrodes 112A", 112B" and 112D" are arranged to cross over active area 108B with corresponding instances of functional intersection 114A; and gate electrode 112C" is arranged to cross over active area 108B with an instance of flyover intersection 114B.

For functional intersections 114A, relative to the vertical direction, the corresponding gate electrode extends a predetermined distance/height, $H_{EXT}$, into gap 118A such that the extension of the gate electrode ("gate-extension") terminates at the edge of gap 118B. In particular, gate electrodes 112A', 112C' and 112D' include corresponding gate-extensions 120A', 120C' and 120D', and gate electrodes 112A", 112B" and 112D" include corresponding gate-extensions 120A", 120B" and 120D". In some embodiments, the extension of the gate electrode is provided to facilitate the functional connection between the gate electrode and the corresponding underlying active region. In some embodiments, the height $H_{EXT}$ in the vertical direction of the gate-extension is less than or equal to about a three times multiple of a width, $W_G$, in the horizontal direction of the gate electrode, wherein:

$$H_{EXT} \leq (\approx 3W_G).$$

For flyover intersections 114B, relative to the vertical direction, the corresponding gate electrode does not extend substantially into gap 118A, where the phrase "does not extend substantially into" should be understood in the context of variations which result from manufacturing process-tolerances. In particular, there are gaps 124B' and 124C" between structure 130 and corresponding gate electrodes 112B' and 112C". Gaps 124B' and 124C" increase vertical separation between structure 130 and corresponding gate electrodes 112B' and 112C". Consequently, gaps 124B' and 124C" increase corresponding resistances to leakage current between structure 130 and corresponding gate electrodes 112B' and 112C", which reduces (and thus improves) an intra/inter layer "ON" state gate leakage of the semiconductor device which includes trimmed-gates region 102.

FIG. 2A is a layout diagram 202A of a trimmed-gates region of a semiconductor device, in accordance with some embodiments. In some embodiments, a trimmed-gates region of a semiconductor device which will be produced from layout diagram 202A is trimmed-gates region 102 of FIG. 1B. As such, FIG. 2A is similar to FIG. 1B. Accordingly, relative to FIG. 1B, the numbering of similar objects in FIG. 2A is increased by 100.

In FIG. 2A, active area ("AR") patterns 208A-208B are generated as substantially rectangular shapes which are disposed on and/or over a surface 206, where surface 206 represents substrate 106, and where long axes of AR patterns 208A-208B are substantially parallel to the first direction. In FIG. 2A, the first direction is the horizontal direction. In some embodiments, the first direction is a direction other than the horizontal direction. Active regions 108A-108B are examples of active regions resulting from AR patterns 208A-208B. AR patterns 208A-208B are separated by a gap 218A, relative to the second direction. Gate patterns 212A, 212B, 212C and 212D are generated as substantially rectangular shapes which are disposed over corresponding AR patterns 208A-208B, where long axes of gate patterns 212A, 212B, 212C and 212D are substantially parallel to the second direction. After the effects of cut-patterns (see discussion below) are taken into consideration, gate electrodes 112A', 112A", 112B', 112B", 112C', 112C", 112D' and 112D" are examples of gate electrodes resulting from corresponding gate patterns 212A, 212B, 212C and 212D.

Depending upon the semiconductor device(s) which is intended to be produced based at least in part on layout diagram 202A, one or more portions of one or more of gate patterns 212A-212D eventually will be removed/cut. An instance of a cut pattern is used to indicate one or more portions of corresponding one or more gate patterns 212A-

212D which eventually will be removed/cut. For simplicity of illustration, FIG. 2A shows three cut patterns.

To produce a gap 218B, a cut-pattern 216 is generated as a substantially rectangular shape which is disposed on gate patterns 212A-212D, where a long axis of cut-pattern 216 is substantially parallel to the first direction. In some embodiments, cut-pattern 216 has other shapes. In some embodiments, multiple cut patterns are provided which, in the aggregate, result in substantially the same amounts of gate patterns 212A-212D being removed as would be removed by cut-pattern 216, where the phrase "substantially the same" should be understood in the context of variations which result from manufacturing process-tolerances.

Each of gate patterns 212A, 212B, 212C and 212D includes an intra-gap segment 213W which lies over ("overlies") gap 218A. Each intra-gap segment 213W includes a central region 213X and two end regions 213Y and 213Z. For each intra-gap segment 213W: midlines of central region 213X and of gap 218 are substantially aligned in the vertical direction, where the phrase "substantially aligned" should be understood in the context of variations which result from manufacturing process-tolerances; central region 213X has a height in the vertical direction which is substantially the same as the height in the vertical direction of gap 218B; end region 213Y extends between central region 213X and AR pattern 208A; and end region 213Z extends between central region 213X and AR pattern 208A. In FIG. 2A, a midline of a structure is oriented perpendicularly to the long axis of the structure. By contrast, a centerline of a structure is oriented parallel to the long axis of the structure.

Depending also upon the semiconductor device(s) which is intended to be produced based at least in part on layout diagram 202A, either a functional intersection 214A or a flyover intersection 214B is arranged at each instance where gate patterns 212A-212D cross over corresponding portions of AR patterns 208A-208B. In FIG. 2B: gate patterns 212A, 212C and 212D are arranged to cross over AR 208A with corresponding instances of functional intersection 214A; gate pattern 212B is arranged to cross over AR 208A with an instance of flyover intersection 214B; gate patterns 212A, 212B and 212D are arranged to cross over AR 208B with corresponding instances of functional intersection 214A; and gate pattern 212C is arranged to cross over AR 208B with an instance of flyover intersection 214B.

For functional intersections 214A, after the effects of cut-pattern 216 are taken into consideration and relative to the vertical direction, a gate electrode resulting from the corresponding gate pattern will extend a predetermined distance/height, $H_{EXT}$, into gap 218A such that the extension of the gate electrode ("gate-extension") terminates at the edge of gap 218B, where gap 218B results from cut-pattern 216. In particular, gate electrodes 112A' and 112A" resulting from gate pattern 212A include corresponding gate-extensions 120A' and 120A". Gate electrode 112B" resulting from gate pattern 212B includes gate-extension 120B". Gate electrode 112C' resulting from gate pattern 212C includes gate-extension 120C'. Gate electrodes 112D' and 112D" resulting from gate pattern 212D include corresponding gate-extensions 120D' and 120D".

Determination of the height in the vertical direction of cut-pattern 216 sets the height of central regions 231X of intra-gap segments 2213W of gate patterns 212A-212D, and consequently sets the heights in the vertical direction of end regions 213Y and 213Z of intra-gap segments 213W. In particular, the height of cut-pattern 216 is set so that, for corresponding ones of end regions 213Y and 213Z, which abut functional intersections 214A, a consequential height of end regions 213Y and 213Z is sufficient to ensure that gate electrodes resulting from corresponding gate patterns 212A-212D will extend a predetermined distance in the second direction beyond functional intersections 214A. In some embodiments, relative to the vertical direction, cut-pattern 130 is sized and disposed between AR patterns 208A-208B such that the height, $H_{EXT}$, in the vertical direction of the resultant gate-extensions is less than or equal to about a three times multiple of a width, $W_G$, in the horizontal direction of the gate pattern, wherein:

$$H_{EXT} \leq (\approx 3W_G).$$

For flyover intersections 214B, after the effects of cut-patterns (discussed above, and further discussed below) are taken into consideration and relative to the vertical, the corresponding gate pattern substantially will not extend into gap 218A. To prevent a resulting gate from extending into gap 218A, cut-patterns 222B and 222C are generated as substantially rectangular shapes which are disposed on corresponding gate patterns 212B-212C, where a long axis of cut-patterns 222B-222C are substantially parallel to the first direction. In some embodiments, cut-patterns 222B-222C have other shapes. In some embodiments, multiple cut patterns are provided which, in the aggregate, result in substantially the same amounts of gate patterns 212B-212C being removed as would be removed by corresponding cut-patterns 222B-222C. Gaps 124B' and 124C" are examples of gaps resulting from corresponding cut-patterns 222B-222C. In some embodiments, the width, $W_{CP2}$, in the horizontal direction of cut-patterns 222B-222C is set to be sufficiently wide so that an alignment-tolerance in the horizontal direction of cut-patterns 222B-222C is comparable to the alignment tolerance of cut-pattern 216. In some embodiments, the width $W_{CP2}$ of cut-patterns 222B-222C is set to be wider than a width, $W_G$, of gate patterns 212B-212C. In some embodiments, the width $W_{CP2}$ of cut-patterns 222B-222C is set to be less than or equal to about a 12 times multiple of a width $W_G$ of gate patterns 212B-212C, wherein:

$$W_{CP2} \leq (\approx 12W_G).$$

FIG. 2B is a layout diagram 202B of a trimmed-gates region of a semiconductor device, in accordance with some embodiments. In some embodiments, a trimmed-gates region of a semiconductor device which will be produced from layout diagram 202A is trimmed-gates region 102 of FIG. 1B.

Layout diagram 202B is a version of layout diagram 202A of FIG. 2A, where layout diagram 202B shows the results of cut-patterns 216 and 222B-222C. As such, FIG. 2B is similar to FIG. 2A. Accordingly, FIG. 2A follows the 'two-series' numbering scheme of FIG. 2A. Though FIG. 2B shows the results of cut-patterns 216 and 222B-222C, nevertheless FIG. 2B still shows patterns rather than structures resulting from such patterns, hence FIG. 2B is a pre-cut layout diagram rather than a post-cut layout diagram.

In FIG. 2B, gap 218B results from cut-pattern 216. Gaps 124B' and 124C" result from corresponding cut-patterns 222B and 222C. Also, as a result of cut-patterns 216, 222B and 222C: gate pattern 212A is divided and reduced to residual gate patterns 212A' and 212A"; gate pattern 212B is divided and reduced to residual gate patterns 212B' and 212B"; gate pattern 212C is divided and reduced to residual gate patterns 212C' and 212C"; and gate pattern 212D is divided and reduced to residual gate patterns 212D' and 212D". Again, at flyover intersection 214B where the gate electrode resulting from gate pattern 212B' crosses the active region resulting from AR pattern 208A, the extension of the gate electrode that otherwise would be present is eliminated by the inclusion of cut-pattern 222B in FIG. 2A, which results in gap 124B' in FIG. 2B. Also, at flyover intersection 214B where the gate electrode resulting from gate pattern 212C" crosses the active region resulting from AR pattern 208B, the extension of the gate electrode that otherwise would be present is eliminated by the inclusion of cut-pattern 222C in FIG. 2A, which results in gap 124C" in FIG. 2B.

Figure 3A:
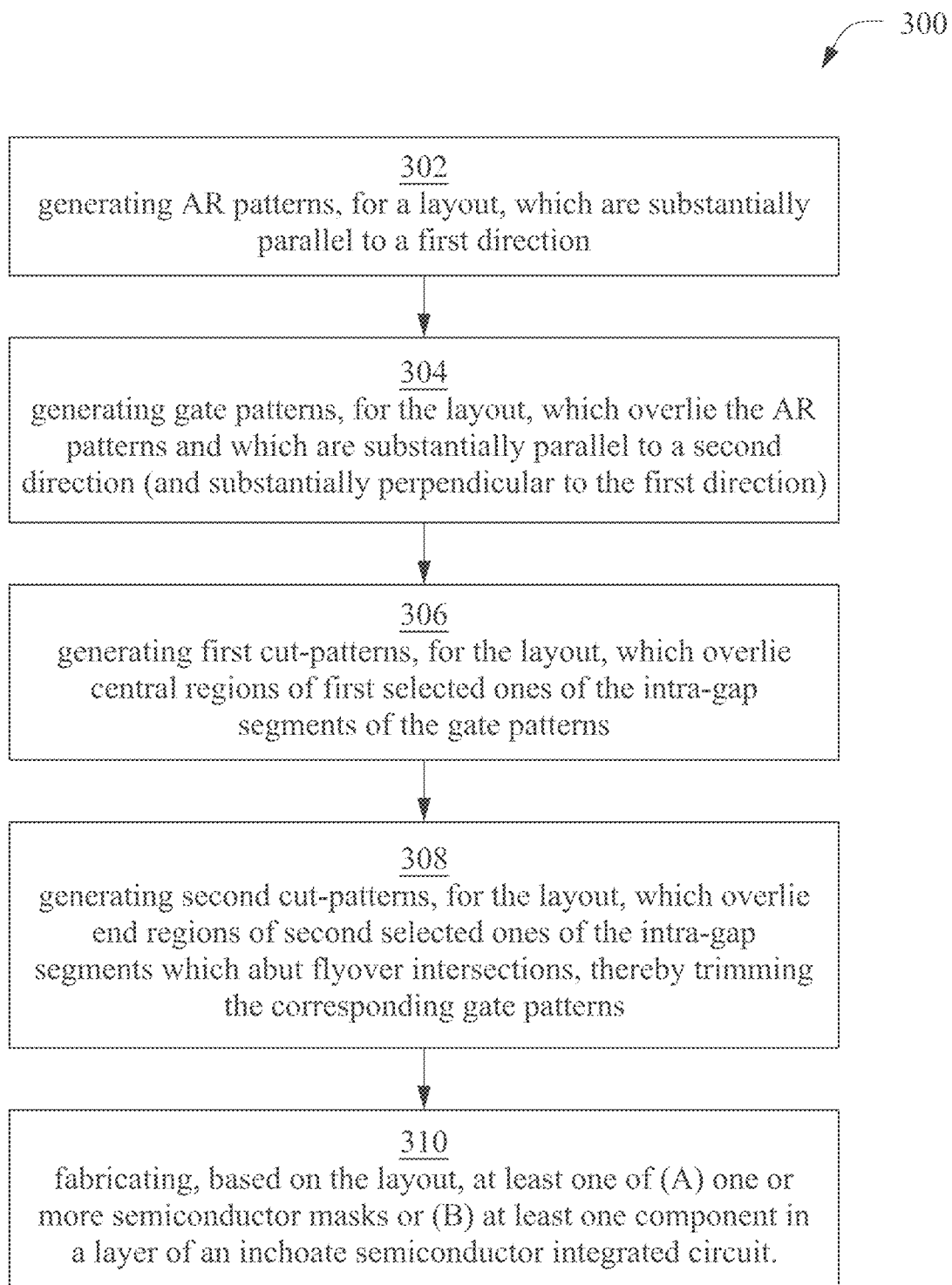
FIG. 3A is a flowchart of a method of generating a layout of a semiconductor device, in accordance with some embodiments.

FIG. 3A is a flowchart of a method 300 of generating a layout of a semiconductor device, in accordance with some embodiments. In some embodiments, method 300 is used to generate an instance of layout diagram 202A of a trimmed-gates region 102 of a semiconductor device.

In FIG. 3A, the flowchart of method 300 includes blocks 302-310. At least one of blocks 302, 304, 306 or 308 is executed by a processor of a computer. An example of the processor is a processor 402 of FIG. 4 (discussed below). An example of the computer is an electronic design automation (EDA) system 400 of FIG. 4 (discussed below). In some embodiments, each of blocks 302-308 is executed by the processor of the computer. In some embodiments, the layout generated by method 300 is stored on a non-transitory computer-readable medium. An example of the non-transitory computer-readable medium is layout 407 of FIG. 4 (discussed below).

At a block 302 of FIG. 3, AR patterns are generated for the layout. The AR patterns are arranged in a first grid oriented parallel to a first direction. An example of the first grid is grid 103A of FIG. 2A, and an example of the first direction is the horizontal direction. Examples of the AR patterns are AR patterns 208A-208B of FIG. 2A. From block 302, flow proceeds to a block 304. At block 304, gate patterns are generated for the layout. The gate patterns are arranged spaced apart in a second grid and overlie corresponding ones of the AR patterns. The second grid is oriented parallel to a second direction, where the second direction is orthogonal to the first direction. An example of the second grid is grid 103C of FIG. 2A, and an example of the second direction is the vertical direction. Examples of the gate patterns are gate patterns 212A-212D of FIG. 2A. Gaps, which are interspersed between neighboring ones of the AR patterns, are overlied by corresponding intra-gap segments of the gate patterns. Each intra-gap segment includes two end regions separated by a central region. Examples of the intra-gap segments are intra-gap segments 213W of FIG. 2A. As such, examples of the central regions are central regions 213X, and examples of end regions are corresponding end regions 231Y and 213Z. From block 304, flow proceeds to a block 306.

At block 306, first cut-patterns are generated which overlie the central regions of first selected ones of the intra-gap segments. Examples of the first cut-patterns are instances of cut-pattern 216 of FIG. 2A. From block 306, flow proceeds to a block 308. At block 308, second cut-patterns are generated which overlie the end regions of second selected ones of the intra-gap segments which abut flyover intersections, thereby trimming the corresponding gate patterns. Examples of the second cut-patterns are cut-patterns 222B and 222C of FIG. 2A. Again, cut-pattern 222B abuts flyover intersection 214B where the gate electrode resulting from gate pattern 212B' crosses the active region resulting from AR pattern 208A. Also, again, cut pattern 222C abuts flyover intersection 214B where the gate electrode resulting from gate pattern 212C" crosses the active region resulting from AR pattern 208B. From block 308, flow proceeds to a block 310. At block 310, based on the layout, at least one of (A) one or more semiconductor masks is fabricated (see FIG. 5, discussed below) or (B) at least one component in a layer of an inchoate semiconductor integrated circuit is fabricated (again, see FIG. 5, discussed below).

Figure 3B:
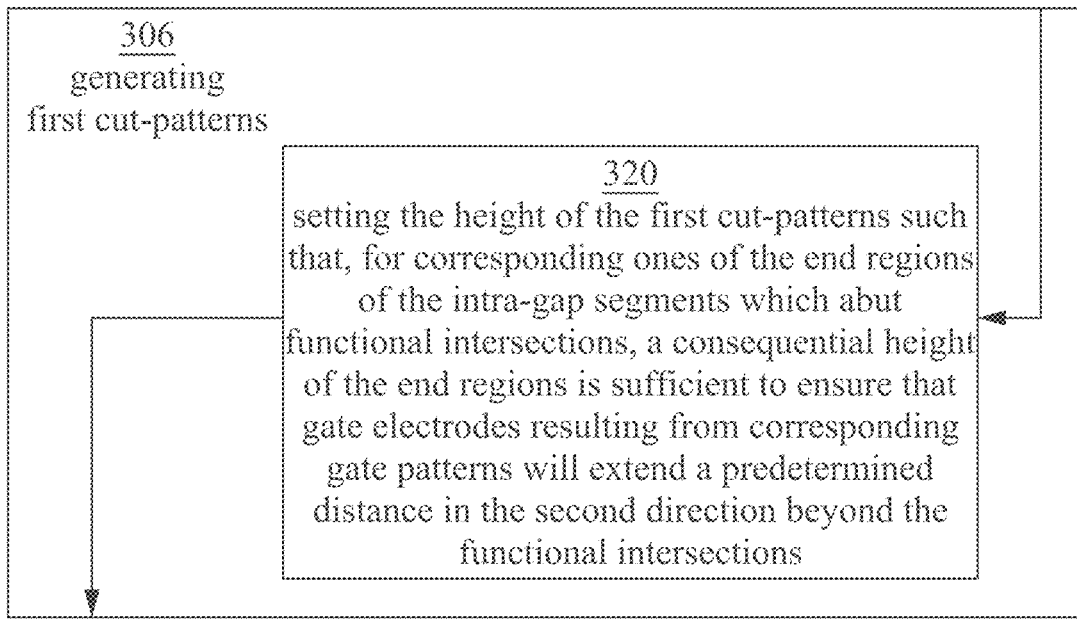
FIG. 3B is a more detailed view of a block in FIG. 3A, in accordance with at least one embodiment of the present disclosure.

FIG. 3B is a more detailed view of block 306 of FIG. 3A, in accordance with at least one embodiment of the present disclosure.

In FIG. 3B, block 306 includes a block 320. At block 320, the height of the first cut-patterns is set. Each gap, central region and end region has a corresponding height in the second direction. Determination of the height of the first cut-patterns sets the height of the central regions of the intra-gap segments of the gate patterns and consequently sets the heights of end regions of the intra-gap segments of the gate patterns. In particular, the height of the first cut-patterns is set so that, for corresponding ones of the end regions of the intra-gap segments which abut functional intersections, a consequential height of the end regions is sufficient to ensure that gate electrodes resulting from corresponding gate patterns will extend a predetermined distance in the second direction beyond the functional intersections. Examples of the end regions of the intra-gap segments which abut functional intersections are end regions 213Y from which result gate extensions 220A', 220C' and 220D', and end regions 213Z from which result gate extensions 220A", 220B" and 220D".

Figure 3C:
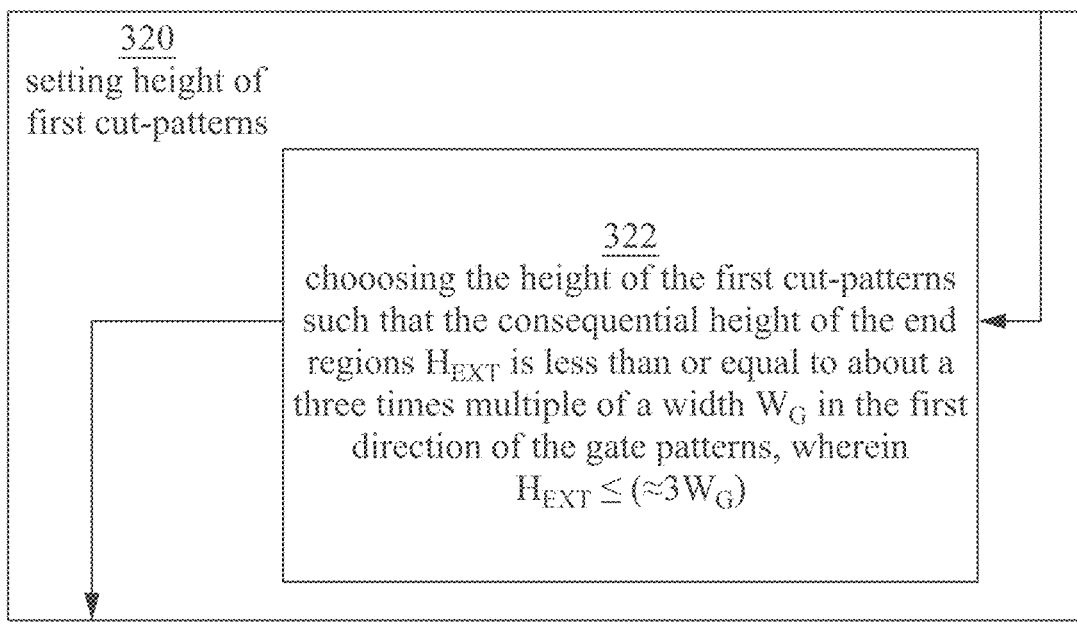
FIG. 3C is a more detailed view of a block in FIG. 3B, in accordance with at least one embodiment of the present disclosure.

FIG. 3C is a more detailed view of block 320 of FIG. 3B, in accordance with at least one embodiment of the present disclosure.

In FIG. 3C, block 320 includes a block 322. At block 322, the height of the first cut-patterns is chosen. In particular, the height of the first cut-patterns is chosen such that the consequential height of the end regions $H_{EXT}$ is less than or equal to about a three times multiple of a width $W_G$ in the first direction of the gate patterns, wherein:

$$H_{EXT} \leq (\approx 3W_G).$$

Figure 3D:
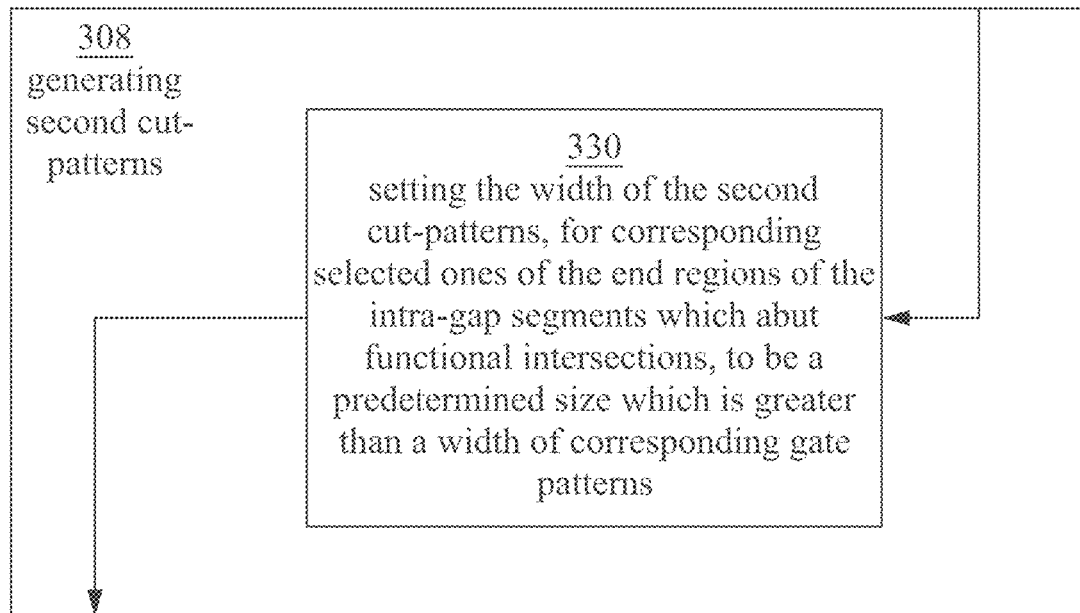
FIG. 3D is a more detailed view of a block in FIG. 3A, in accordance with at least one embodiment of the present disclosure.

FIG. 3D is a more detailed view of block 308 of FIG. 3A, in accordance with at least one embodiment of the present disclosure.

In FIG. 3D, block 308 includes a block 330. At block 330, the width in the horizontal direction the second cut-patterns is set. Each gate pattern and second cut-pattern has a corresponding width in the first direction. For corresponding ones of the end regions, the width of the second cut-patterns is to be a predetermined size which is greater than the width of corresponding gate patterns.

Figure 3E:
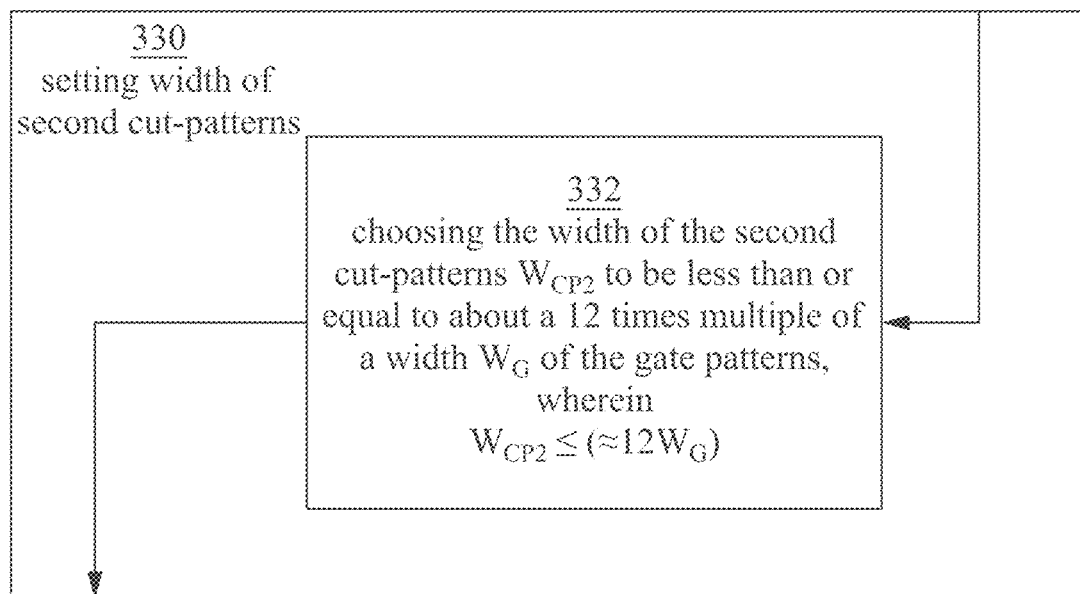
FIG. 3E is a more detailed view of a block in FIG. 3D, in accordance with at least one embodiment of the present disclosure.

FIG. 3E is a more detailed view of block 330 of FIG. 3D, in accordance with at least one embodiment of the present disclosure.

In FIG. 3E, block 330 includes a block 332. At block 332, the width of the second cut-patterns $W_{CP2}$ is chosen to be less than or equal to about a 12 times multiple of a width $W_G$ of the gate patterns, wherein:

$$W_{CP2} \leq (\approx 12W_G).$$

Figure 3F:
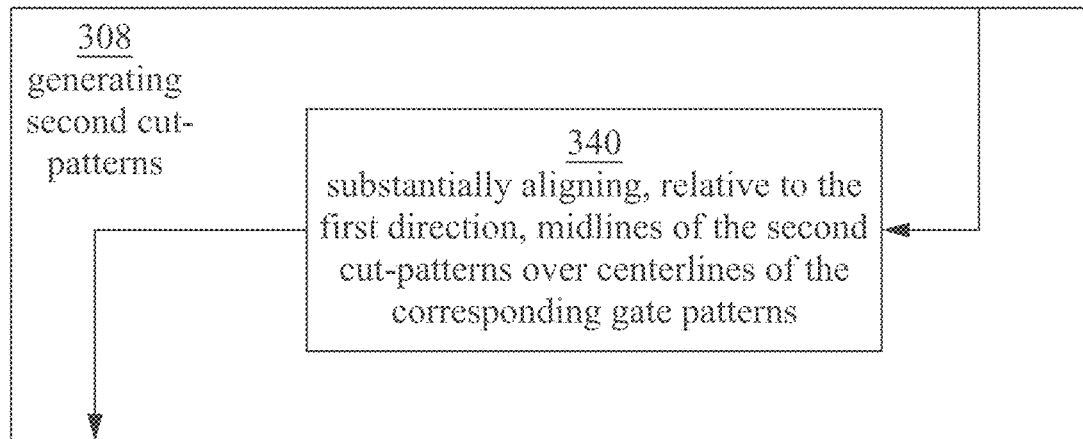
FIG. 3F is a more detailed view of a block in FIG. 3A, in accordance with at least one embodiment of the present disclosure.

FIG. 3F is another more detailed view of block 308 of FIG. 3A, in accordance with at least one embodiment of the present disclosure.

In FIG. 3F, block 308 includes a block 340. At block 340, relative to the first direction, the midlines of the second cut-patterns are aligned over centerlines of the corresponding gate patterns. Again, a centerline of a structure is oriented parallel to the long axis of the structure.

Figure 3G:
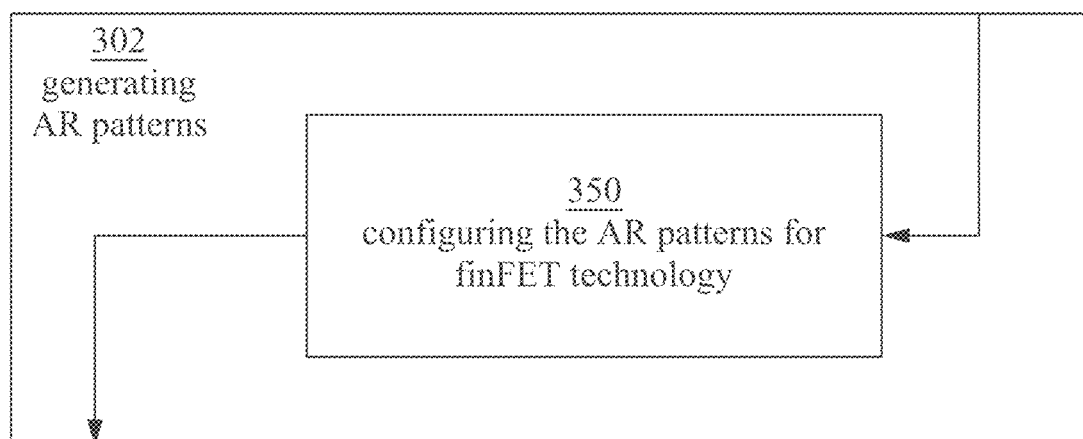
FIG. 3G is a more detailed view of a block in FIG. 3A, in accordance with at least one embodiment of the present disclosure.

FIG. 3G is a more detailed view of block 302 of FIG. 3A, in accordance with at least one embodiment of the present disclosure.

In FIG. 3G, block 302 includes a block 350. At block 350, the AR patterns are configured for finFET technology.

Figure 4:
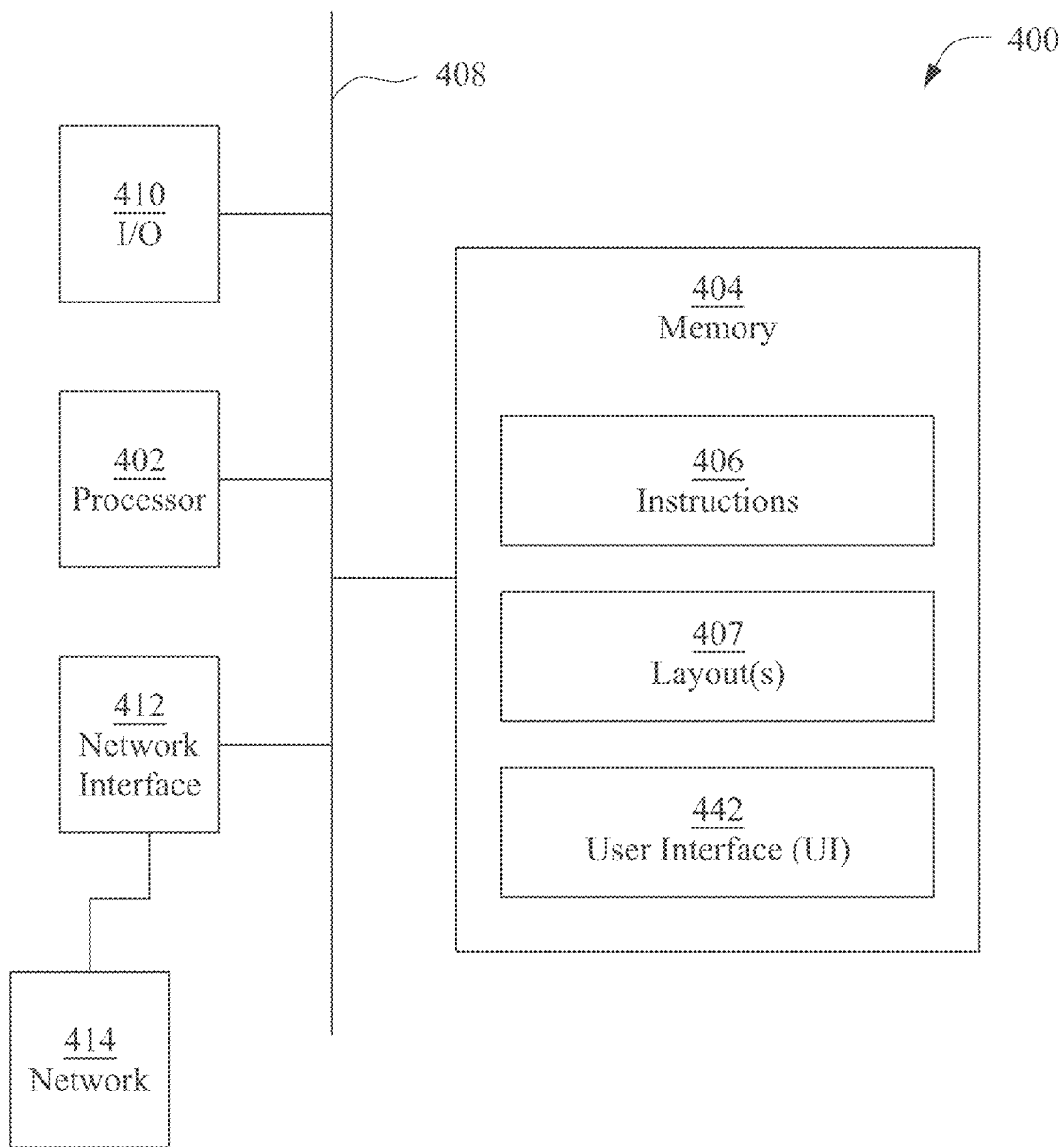
FIG. 4 is a block diagram of an electronic design automation (EDA) system, in accordance with at least one embodiment of the present disclosure.

FIG. 4 is a block diagram of an electronic design automation (EDA) system 400, in accordance with at least one embodiment of the present disclosure.

In some embodiments, EDA system 400 includes an APR system. The method of the flowcharts of FIGS. 3A-3G is implemented, for example, using EDA system 400, in accordance with some embodiments.

In some embodiments, EDA system 400 is a general purpose computing device including a hardware processor 402 and a non-transitory, computer-readable storage medium 404. Storage medium 404, amongst other things, is encoded with, i.e., stores, computer program code 406, i.e., a set of executable instructions. Execution of instructions 406 by hardware processor 402 represents (at least in part) an EDA tool which implements a portion or all of, e.g., the methods of FIGS. 3A-3F, in accordance with one or more embodiments (hereinafter, the noted processes and/or methods).

Processor 402 is electrically coupled to computer-readable storage medium 404 via a bus 408. Processor 402 is also electrically coupled to an I/O interface 410 by bus 408. A network interface 412 is also electrically connected to processor 402 via bus 408. Network interface 412 is connected to a network 414, so that processor 402 and computer-readable storage medium 404 are capable of connecting to external elements via network 414. Processor 402 is configured to execute computer program code 406 encoded in computer-readable storage medium 404 in order to cause system 400 to be usable for performing a portion or all of the noted processes and/or methods. Computer-readable storage medium 404 also includes one or more layouts 407 generated according to a portion or all of the noted processes and/or methods. In one or more embodiments, processor 402 is a central processing unit (CPU), a multi-processor, a distributed processing system, an application specific integrated circuit (ASIC), and/or a suitable processing unit.

In one or more embodiments, computer-readable storage medium 404 is an electronic, magnetic, optical, electromagnetic, infrared, and/or a semiconductor system (or apparatus or device). For example, computer-readable storage medium 404 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 404 includes a compact disk-read only memory (CD-ROM), a compact disk-read/write (CD-R/W), and/or a digital video disc (DVD).

In one or more embodiments, storage medium 404 stores computer program code 406 configured to cause system 400 (where such execution represents (at least in part) the EDA tool) to be usable for performing a portion or all of the noted processes and/or methods. In one or more embodiments, storage medium 404 also stores information which facilitates performing a portion or all of the noted processes and/or methods. In one or more embodiments, storage medium 404 stores a library (not shown) of standard cells.

EDA system 400 includes I/O interface 410. I/O interface 410 is coupled to external circuitry. In one or more embodiments, I/O interface 410 includes a keyboard, keypad, mouse, trackball, trackpad, touchscreen, and/or cursor direction keys for communicating information and commands to processor 402.

Again, EDA system 400 includes network interface 412. Network interface 412 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 400.

System 400 is configured to receive information through I/O interface 410. The information received through I/O interface 410 includes one or more of instructions, data, design rules, libraries of standard cells, and/or other parameters for processing by processor 402. The information is transferred to processor 402 via bus 408. EDA system 400 is configured to receive information related to a UI through I/O interface 410. The information is stored in computer-readable medium 404 as user interface (UI) 442.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 400. In some embodiments, a layout is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 5:
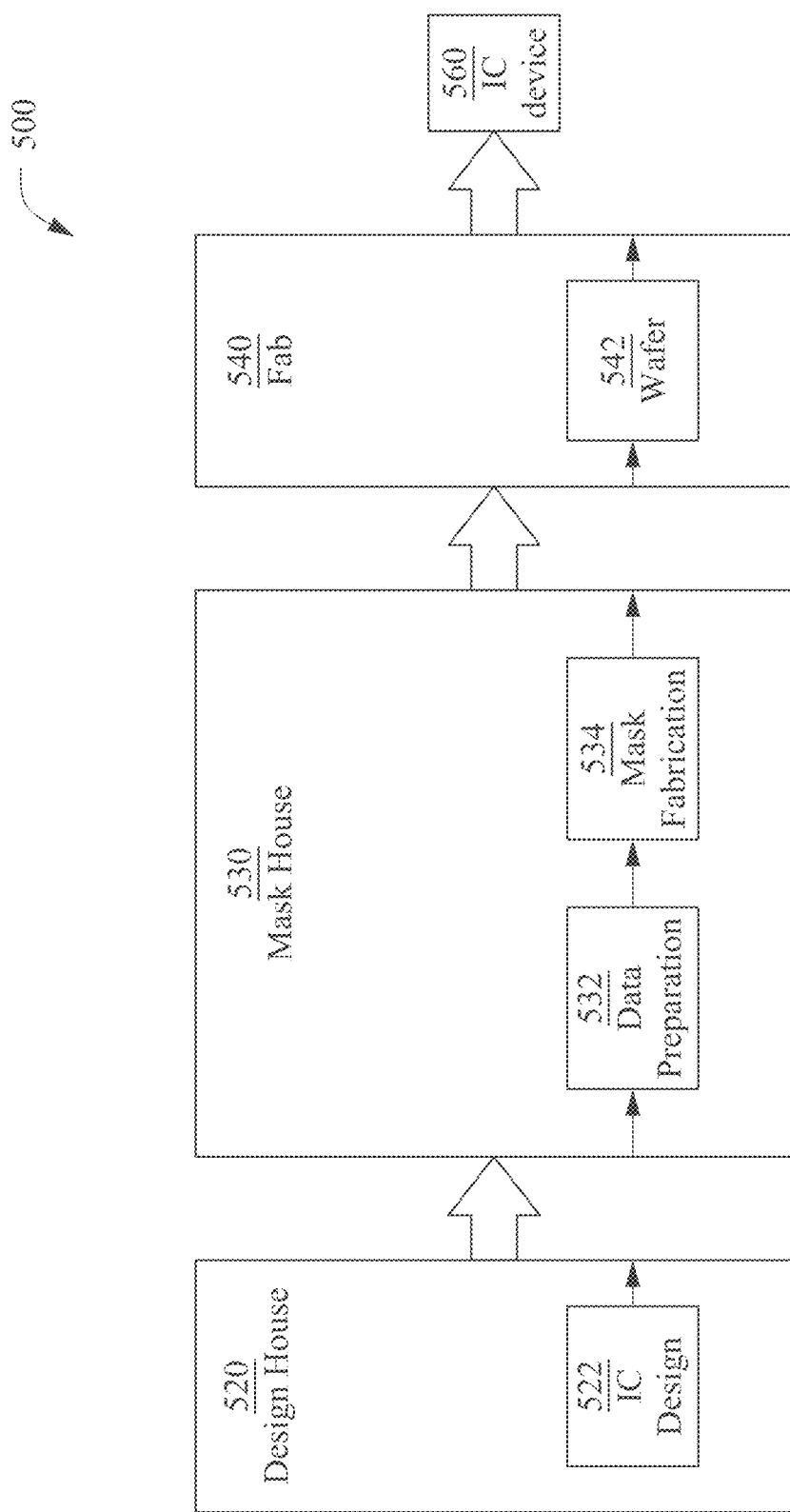
FIG. 5 is a block diagram of an integrated circuit (IC) manufacturing system, and an IC manufacturing flow associated therewith, in accordance with at least one embodiment of the present disclosure.

FIG. 5 is a block diagram of an integrated circuit (IC) manufacturing system 500, and an IC manufacturing flow associated therewith, in accordance with at least one embodiment of the present disclosure.

In FIG. 5, IC manufacturing system 500 includes entities, such as a design house 520, a mask house 530, and an IC manufacturer/fabricator ("fab") 550, that interact with one another in the design, development, and manufacturing cycles and/or services related to manufacturing an IC device 560. The entities in system 500 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 520, mask house 530, and IC fab 550 is owned by a single larger company. In some embodiments, two or more of design house 520, mask house 530, and IC fab 550 coexist in a common facility and use common resources.

Design house (or design team) 520 generates an IC design layout 522. IC design layout 522 includes various geometrical patterns designed for an IC device 560. The geometrical patterns correspond to patterns of metal, oxide, or semiconductor layers that make up the various components of IC device 560 to be fabricated. The various layers combine to form various IC features. For example, a portion of IC design layout 522 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 520 implements a proper design procedure to form IC design layout 522. The design procedure includes one or more of logic design, physical design or place and route. IC design layout 522 is presented in one or more data files having information of the geometrical patterns. For example, IC design layout 522 can be expressed in a GDSII file format or DFII file format.

Mask house 530 includes data preparation 532 and mask fabrication 544. Mask house 530 uses IC design layout 522 to manufacture one or more masks to be used for fabricating the various layers of IC device 560 according to IC design layout 522. Mask house 530 performs mask data preparation 532, where IC design layout 522 is translated into a representative data file ("RDF"). Mask data preparation 532 provides the RDF to mask fabrication 544. Mask fabrication 544 includes a mask writer. A mask writer converts the RDF to an image on a substrate, such as a mask (reticle) or a semiconductor wafer. The design layout is manipulated by mask data preparation 532 to comply with particular characteristics of the mask writer and/or requirements of IC fab 550. In FIG. 5, mask data preparation 532 and mask fabrication 544 are illustrated as separate elements. In some embodiments, mask data preparation 532 and mask fabrication 544 can be collectively referred to as mask data preparation.

In some embodiments, mask data preparation 532 includes optical proximity correction (OPC) which uses lithography enhancement techniques to compensate for image errors, such as those that can arise from diffraction, interference, other process effects and the like. OPC adjusts IC design layout 522. In some embodiments, mask data preparation 532 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 532 includes a mask rule checker (MRC) that checks the IC design layout that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout to compensate for limitations during mask fabrication 544, which may undo part of the modifications performed by OPC in order to meet mask creation rules.

In some embodiments, mask data preparation 532 includes lithography process checking (LPC) that simulates processing that will be implemented by IC fab 550 to fabricate IC device 560. LPC simulates this processing based on IC design layout 522 to create a simulated manufactured device, such as IC device 560. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout 522.

It should be understood that the above description of mask data preparation 532 has been simplified for the purposes of clarity. In some embodiments, data preparation 532 includes additional features such as a logic operation (LOP) to modify the IC design layout according to manufacturing rules. Additionally, the processes applied to IC design layout 522 during data preparation 532 may be executed in a variety of different orders.

After mask data preparation 532 and during mask fabrication 544, a mask or a group of masks are fabricated based on the modified IC design layout. In some embodiments, an electron-beam (e-beam) or a mechanism of multiple e-beams is used to form a pattern on a mask (photomask or reticle) based on the modified IC design layout. The mask can be formed in various technologies. In some embodiments, the mask is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask includes a transparent substrate (e.g., fused quartz) and an opaque material (e.g., chromium) coated in the opaque regions of the mask. In another example, the mask is formed using a phase shift technology. In the phase shift mask (PSM), various features in the pattern formed on the mask are configured to have proper phase difference to enhance the resolution and imaging quality. In various examples, the phase shift mask can be attenuated PSM or alternating PSM. The mask(s) generated by mask fabrication 544 is used in a variety of processes. For example, such a mask(s) is used in an ion implantation process to form various doped regions in the semiconductor wafer, in an etching process to form various etching regions in the semiconductor wafer, and/or in other suitable processes.

IC fab 550 is an IC fabrication business that includes one or more manufacturing facilities for the fabrication of a variety of different IC products. In some embodiments, IC Fab 550 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 550 uses the mask (or masks) fabricated by mask house 530 to fabricate IC device 560. Thus, IC fab 550 at least indirectly uses IC design layout 522 to fabricate IC device 560. In some embodiments, a semiconductor wafer 552 is fabricated by IC fab 550 using the mask (or masks)

to form IC device 560. Semiconductor wafer 55 includes a silicon substrate or other proper substrate having material layers formed thereon. Semiconductor wafer further includes one or more of various doped regions, dielectric features, multilevel interconnects, and the like (formed at subsequent manufacturing steps).

Details regarding an integrated circuit (IC) manufacturing system (e.g., system 500 of FIG. 5), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

In some embodiments, a semiconductor device includes: first and second active regions extending in a first direction and separated by a gap relative to a second direction; and gate structures correspondingly over the first and second active regions, the gate structures extending in the second direction; and for each active region, a portion of each of some but not all of the gate structures (gate extension) extending partially into the gap; and when viewing the gate structures as a group, the group having a notched profile relative to the second direction, where notches in the notched profile correspond to ones of the gate structures which are substantially free of extending into the gap.

In some embodiments, for a functional intersection at which a corresponding gate structure crosses over a corresponding active region and for which the gate structure is functionally connected to the active region, an extension of the gate structure extends a predetermined distance in the second direction beyond the corresponding one of the first and second active regions and into the gap.

In some embodiments, a height HEXT in the second direction of the extension of the gate structure is less than or equal to about a three times multiple of a width WG in the first direction of the gate structure, wherein: $H_{EXT} \leq (\approx 3 W_G)$.

In some embodiments, the active region is configured for finFET technology.

In some embodiments, the semiconductor device further includes: at least one component of a circuit positioned within the gap.

In some embodiments, the semiconductor device further includes: over the gap, one or more metal lines in one or more corresponding metallization layers.

In some embodiments, at least some of the one or more metal lines represent portions of a power grid.

In some embodiments, each of the gate structures which corresponds to one of the notches in the notched profile is free from being functionally coupled to the corresponding one of the first and second active regions.

In some embodiments, each of the gate structures which does not correspond to one of the notches in the notched profile is functionally coupled to the corresponding one of the first and second active regions.

In some embodiments, a method (manufacturing a semiconductor device) includes: forming first and second active regions extending in a first direction and separated by a gap; forming gate structures correspondingly over the first and second active regions, the gate structures extending in a second direction, the second direction being orthogonal to the first direction; and removing central regions of the gate structures, a portion of each of some but not all remnant gate structures (gate extension) extending partially into the gap such that, when viewing the remnant gate structures as a group, the group having a notched profile relative to the second direction, where notches in the notched profile correspond to ones of the remnant gate structures which are substantially free of extending into the gap.

In some embodiments, the forming first and second active regions further includes: forming at least one component of a semiconductor integrated circuit (IC) in a corresponding at least one of the first and second active regions.

In some embodiments, the forming gate structures further includes: at an intersection between a corresponding one of the first and second active regions and a corresponding one of the gate structures that is designated to be functional (functional intersection), making a functional connection between the corresponding one of the first and second active regions and the corresponding one of the gate structures.

In some embodiments, the forming first and second active regions further includes locating intra-gap segments of the gate structures correspondingly over the gap, and arranging each intra-gap segment to include two end regions separated by a central region; and each of the end regions extends a corresponding overhang distance in the second direction from the corresponding one of the first and second active regions towards the corresponding one of the central regions of the intra-gap segments; the intra-gap segments abut corresponding functional intersections; and for each end region of the intra-gap segments, the corresponding overhang distance is approximately equal to a predetermined value which facilitates making a functional connection between the corresponding one of the first and second active regions and the corresponding one of the gate structures.

In some embodiments, each of the gate structures has substantially a same width in the first direction; and the predetermined value is less than or equal to about a three times multiple of the width of the gate structures.

In some embodiments, each of the gate structures has substantially a same width in the first direction; and the predetermined value is greater than of the width of the gate structures.

In some embodiments, the method further includes: over locations formerly corresponding to the central regions of the intra-gap segments, forming one or more metal lines in one or more corresponding metallization layers.

In some embodiments, at least some of the one or more metal lines represent portions of a power grid.

In some embodiments, a semiconductor device includes: first and second active regions extending in a first direction and separated by a gap relative to a second direction; and gate structures correspondingly over the first and second active regions, the gate structures extending in the second direction; and for each active region, a portion of each of some but not all of the gate structures (gate extension) extending partially into the gap; and when viewing the gate structures as a group, the group having a notched profile relative to the second direction, where notches in the notched profile correspond to ones of the gate structures which are substantially free of extending into the gap.

In some embodiments, each of the gate structures which does not correspond to one of the notches in the notched profile is functionally coupled to the corresponding one of the first and second active regions at a corresponding functional intersection.

In some embodiments, for each functional intersection at which a corresponding gate structure crosses over a corresponding active region and for which the gate structure is functionally connected to the active region, an extension of the gate structure extends a predetermined distance in the second direction beyond the corresponding one of the first and second active regions and into the gap.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A semiconductor device comprising:
   first and second active regions extending in a first direction and separated by a gap relative to a second direction substantially orthogonal to the first direction; and
   gate structures correspondingly over the first and second active regions, the gate structures extending in the second direction; and
   for each active region, a portion of each of some but not all of the gate structures (gate extension) extending partially into the gap; and
   when viewing the gate structures as a group, the group having a notched profile relative to the second direction, where notches in the notched profile correspond to ones of the gate structures which are of extending into the gap.

2. The semiconductor device of claim 1, wherein:
   for a functional intersection at which a corresponding given one of the gate structures crosses over a corresponding given one of the first or second active regions and for which the given gate structure is functionally connected to the given active region, an extension of the given gate structure extends a predetermined distance in the second direction beyond the given active region and into the gap.

3. The semiconductor device of claim 2, wherein:
   a height $H_{EXT}$ in the second direction of the extension of the gate structure is less than or equal to about a three times multiple of a width WG in the first direction of the gate structure, wherein:

$H_{EXT} \leq (\approx 3W_G)$.

4. The semiconductor device of claim 1, wherein:
   each of the first and second active regions is configured for finFET technology.

5. The semiconductor device of claim 1, further comprising:
   at least one component of a circuit positioned within the gap.

6. The semiconductor device of claim 1, further comprising:
   over the gap, one or more metal lines in one or more corresponding metallization layers.

7. The semiconductor device of claim 6, wherein:
   at least some of the one or more metal lines represent portions of a power grid.

8. The semiconductor device of claim 1, wherein:
   each of the gate structures which corresponds to one of the notches in the notched profile is functionally coupled to the corresponding one of the first and second active regions.

9. The semiconductor device of claim 1, wherein:
   each of the gate structures which does not correspond to one of the notches in the notched profile is functionally coupled to the corresponding one of the first and second active regions.

10. A method of manufacturing a semiconductor device, the method comprising:
    forming first and second active regions extending in a first direction and separated by a gap;
    forming gate structures correspondingly over the first and second active regions, the gate structures extending in a second direction, the second direction being substantially orthogonal to the first direction; and
    removing central regions of the gate structures, a portion of each of some but not all remnant gate structures (gate extension) extending partially into the gap such that, when viewing the remnant gate structures as a group, the group having a notched profile relative to the second direction, where notches in the notched profile correspond to ones of the remnant gate structures which are extending into the gap.

11. The method of claim 10, wherein the forming first and second active regions further includes:
    forming at least one component of a semiconductor integrated circuit (IC) in a corresponding at least one of the first and second active regions.

12. The method of claim 10, wherein the forming gate structures further includes:
    at an intersection between a corresponding one of the first and second active regions and a corresponding one of the gate structures that is designated to be functional (functional intersection), making a functional connection between the corresponding one of the first and second active regions and the corresponding one of the gate structures.

13. The method of claim 12, wherein:
    the forming first and second active regions further includes:
      locating intra-gap segments of the gate structures correspondingly over the gap; and
      arranging each intra-gap segment to include two end regions separated by a central region;
    each of the end regions extends a corresponding overhang distance in the second direction from the corresponding one of the first and second active regions towards the corresponding one of the central regions of the intra-gap segments;
    the intra-gap segments abut corresponding functional intersections; and
    for each end region of the intra-gap segments, the corresponding overhang distance is approximately equal to a predetermined value which facilitates making a functional connection between the corresponding one of the first and second active regions and the corresponding one of the gate structures.

14. The method of claim 13, wherein:
    each of the gate structures has substantially a same width in the first direction; and
    the predetermined value is less than or equal to about a three times multiple of the width of the gate structures.

15. The method of claim 13, wherein:
    each of the gate structures has substantially a same width in the first direction; and
    the predetermined value is greater than of the width of the gate structures.

16. The method of claim 15, further comprising:
    over locations formerly corresponding to the central regions of the intra-gap segments, forming one or more metal lines in one or more corresponding metallization layers.

17. The method of claim 16, wherein:
at least some of the one or more metal lines represent portions of a power grid.

18. A semiconductor device comprising:
first and second active regions extending in a first direction and separated by a gap relative to a second direction substantially orthogonal to the first direction; and
gate structures correspondingly over the first and second active regions, the gate structures extending in the second direction; and
for each active region, a portion of each of some but not all of the gate structures (gate extension) extending partially into the gap; and
when viewing the gate structures as a group, the group having a notched profile relative to the second direction, where notches in the notched profile correspond to ones of the gate structures which are extending into the gap; and
each of the gate structures which corresponds to one of the notches in the notched profile being functionally coupled to the corresponding one of the first and second active regions.

19. The semiconductor device of claim 18, wherein:
each of the gate structures which does not correspond to one of the notches in the notched profile is functionally coupled to the corresponding one of the first and second active regions at a corresponding functional intersection.

20. The semiconductor device of claim 19, wherein:
for each functional intersection at which a corresponding given one of the gate structures crosses over a corresponding one of the first or second active regions and for which the given gate structure is functionally connected to the given active region, an extension of the giv ate structure extends a predetermined distance in the second direction beyond the given active region and into the gap.

* * * * *